US012655515B2

(12) United States Patent
Wang et al.

(10) Patent No.: US 12,655,515 B2
(45) Date of Patent: Jun. 16, 2026

(54) IN SITU AND TUNABLE DEPOSITION OF A FILM

(71) Applicant: Taiwan Semiconductor Manufacturing Company, Ltd., Hsinchu (TW)

(72) Inventors: Chia-Hsi Wang, Changhua County (TW); Yen-Yu Chen, Taichung City (TW); Jen-Hao Chien, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/230,669

(22) Filed: Aug. 7, 2023

(65) Prior Publication Data

US 2023/0374654 A1 Nov. 23, 2023

Related U.S. Application Data

(62) Division of application No. 17/581,958, filed on Jan. 23, 2022, now Pat. No. 12,359,307.

(Continued)

(51) Int. Cl.
*C23C 14/54* (2006.01)
*C23C 14/06* (2006.01)
(Continued)

(52) U.S. Cl.
CPC .......... *C23C 14/548* (2013.01); *C23C 14/067* (2013.01); *C23C 14/3407* (2013.01);
(Continued)

(58) Field of Classification Search
CPC ................................................... C23C 14/548
See application file for complete search history.

(56) References Cited

U.S. PATENT DOCUMENTS

| | | | |
|---|---|---|---|
| 9,627,187 B2 * | 4/2017 | Ishihara | H01J 37/3447 |
| 2009/0166195 A1 * | 7/2009 | Kobayashi | H01J 37/3447 |
| | | | 204/298.11 |

(Continued)

FOREIGN PATENT DOCUMENTS

| | | | | |
|---|---|---|---|---|
| EP | 0152577 A2 * | 8/1985 | | C23C 14/548 |
| WO | WO-2013071484 A1 * | 5/2013 | | C23C 14/28 |

OTHER PUBLICATIONS

Platt, Christopher et al., Magnetic and Structural Properties of FeCoB Thin Films, IEEE Transactions on Magnetics, vol. 37, No. 4, Jul. 2001, p. 2302-2304.*

(Continued)

*Primary Examiner* — John J Brayton
(74) *Attorney, Agent, or Firm* — KILPATRICK TOWNSEND & STOCKTON LLP

(57) ABSTRACT

A method is provided. The method includes the following steps: introducing a first physical vapor deposition (PVD) target and a second PVD target in a PVD system, the first PVD target containing a boron-containing cobalt iron alloy (FeCoB) with an initial boron concentration, and the second PVD target containing boron; determining parameters of the PVD system based on a target boron concentration larger than the initial boron concentration; and depositing a FeCoB film on a substrate according to the parameters of the PVD system.

20 Claims, 7 Drawing Sheets

Related U.S. Application Data

(60) Provisional application No. 63/227,999, filed on Jul. 30, 2021.

(51) Int. Cl.

| | |
|---|---|
| *C23C 14/34* | (2006.01) |
| *C23C 14/35* | (2006.01) |
| *C23C 14/52* | (2006.01) |
| *G01N 23/2273* | (2018.01) |
| *H01J 37/34* | (2006.01) |
| *H10N 50/10* | (2023.01) |

(52) U.S. Cl.
CPC ........ *C23C 14/3492* (2013.01); *C23C 14/352* (2013.01); *C23C 14/52* (2013.01); *G01N 23/2273* (2013.01); *H01J 37/3429* (2013.01); *H01J 37/3447* (2013.01); *H01J 37/345* (2013.01); *G01N 2223/6116* (2013.01); *H01J 37/3435* (2013.01); *H10N 50/10* (2023.02)

(56) References Cited

U.S. PATENT DOCUMENTS

| | | | |
|---|---|---|---|
| 2010/0078310 A1* | 4/2010 | Tsunekawa | ......... H01F 10/3254 |
| | | | 204/192.2 |
| 2010/0080894 A1 | 4/2010 | Tsunekawa et al. | |
| 2013/0270104 A1 | 10/2013 | Yang et al. | |
| 2019/0287590 A1 | 9/2019 | Yoshikawa | |
| 2020/0203071 A1 | 6/2020 | Falub et al. | |

OTHER PUBLICATIONS

Platt et al. "Magnetic and Structural Properties of FeCoB Thin Films". IEEE Transactions on Magnetics vol. 37, No. 4 Jul. 2001 (Year: 2001).

\* cited by examiner

500

Introduce a FeCoB$_{20\%}$ PVD target and a boron PVD target in a PVD system 502

Determine parameters of the PVD system based on a target boron concentration 504

Deposit a FeCoB film on a substrate according to the parameters of the PVD system 506

600

Deposit a FeCoB film on a substrate using a $FeCoB_{20\%}$ PVD target and a boron PVD target 602

Monitor the boron concentration of the film 604

The different between the boron concentration and the target boron concentration below a threshold? 606

YES

NO

Adjust the PVD parameters based on the difference 608

IN SITU AND TUNABLE DEPOSITION OF A FILM

CROSS-REFERENCES TO RELATED APPLICATIONS

The present application is a divisional application of U.S. patent application Ser. No. 17/581,958, filed Jan. 23, 2022, which claims priority to U.S. Provisional Patent Application No. 63/227,999, filed on Jul. 30, 2021, and entitled "APPA-RATUS AND METHOD FOR PHYSICAL VAPOR DEPO-SITION," the entire disclosure of which is incorporated herein by reference.

FIELD

Embodiments of the present disclosure relate generally to physical vapor deposition (PVD), and more particularly to in situ and tunable deposition of a film using a PVD system.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area.

While some integrated device manufacturers (IDMs) design and manufacture integrated circuits (IC) themselves, fabless semiconductor companies outsource semiconductor fabrication to semiconductor fabrication plants or foundries. Semiconductor fabrication consists of a series of processes in which a device structure is manufactured by applying a series of layers onto a substrate. This involves the deposition and removal of various thin film layers. The areas of the thin film that are to be deposited or removed are controlled through photolithography. Each deposition and removal process is generally followed by cleaning as well as inspec-tion steps. Therefore, both IDMs and foundries rely on numerous semiconductor equipment and semiconductor fab-rication materials, often provided by vendors. There is always a need for customizing or improving those semicon-ductor equipment and semiconductor fabrication materials, which results in more flexibility, reliability, and cost-effec-tiveness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
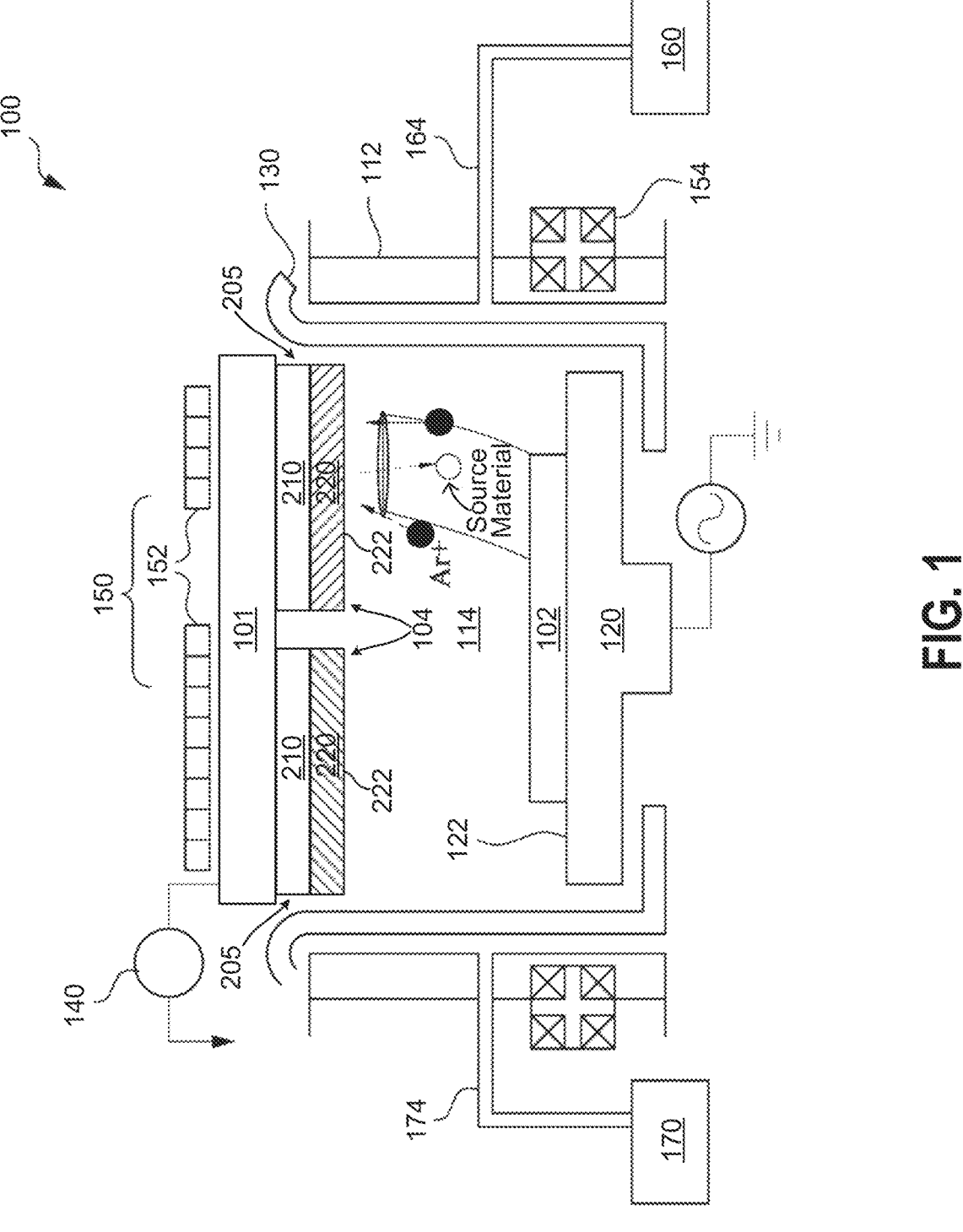
FIG. 1 is a schematic diagram illustrating an example PVD system in accordance with some embodiments.

The following disclosure provides many different embodiments, or examples, for implementing different fea-tures of the subject matter provided. Specific examples of components and arrangements are described below to sim-plify the present disclosure. These are, of course, merely examples and are not intended to be limiting. For example, the formation of a first feature over or on a second feature in the description that follows may include embodiments in which the first and second features are formed in direct contact, and may also include embodiments in which addi-tional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accord-ingly.

Some embodiments of the disclosure are described. Addi-tional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Physical vapor deposition (PVD) is a common process for depositing a film of material on a substrate and is commonly used in semiconductor fabrication. The PVD process is carried out at a high vacuum in a chamber containing a substrate (e.g., a wafer) and a solid source or slab of the material (i.e., a "PVD target" or a "target") to be deposited on the substrate. In the PVD process, the PVD target is physically converted from a solid into a vapor. The vapor of the target material is transported from the PVD target to the substrate, where it is condensed on the substrate as a film.

There are many methods for accomplishing PVD, includ-ing evaporation, e-beam evaporation, plasma spray deposi-tion, and sputtering. Among those methods, sputtering is usually the most frequently used method for accomplishing PVD. During sputtering, gas plasma is created in the chamber and directed to the PVD target. The plasma physically dislodges or erodes (sputters) atoms or molecules from the reaction surface of the PVD target into a vapor of the target material, as a result of a collision with high-energy particles (ions) of the plasma. The vapor of sputtered atoms or molecules of the target material is transported to the substrate through a region of reduced pressure and condenses on the substrate, forming the film of the target material.

Some PVD targets contain more than one element. One example is an alloy of iron (Fe), cobalt (Co), and boron (B), which is sometimes also referred to as a boron-containing cobalt iron alloy (FeCoB). FeCoB is sometimes represented as $Fe_xCo_yB_z$, where x, y, z are atomic percentages of iron, cobalt, and boron, respectively, and x+y+z=100%. FeCoB is, for example, widely used in magnetic tunnel junction (MTJ), which is a building block of magnetoresistive random-access memory (MRAM) devices. In one example, a MTJ has a reference layer, a free layer, and a tunnel barrier layer between the free layer and the pinned layer, and the reference layer, the tunnel barrier layer, and the free layer are made of FeCoB, MgO, and FeCoB, respectively.

Some commonly used boron concentrations of FeCoB are 20%, 30%, 40%, and 50%, corresponding to $FeCoB_{20}\%$, $FeCoB_{30}\%$, $FeCoB_{40}\%$, and $FeCoB_{50}\%$, respectively. FeCoB has different phases as the boron concentration increases. When the boron concentration is relatively low (e.g., $FeCoB_{20}\%$, $FeCoB_{30}\%$, etc.), the FeCoB has a phase $(Fe,Co)_2B$; when the boron concentration increases (e.g., $FeCoB_{50}\%$), the FeCoB has a phase $(Fe,Co)B$. There is a transition phase between those two situations, where those two phases $(Fe,Co)_2B$ and $(Fe,Co)B$ are coexisting. $FeCoB_{40}\%$ happens to be within this transition phase. As a result, $FeCoB_{40}\%$ PVD targets are not as stable as other FeCoB PVD targets, such as $FeCoB_{20}\%$ PVD targets, and they are easy to crack. Additionally, FeCoB PVD targets are usually provided by vendors, and the long-distance transportation from vendors to foundries and IDMs makes $FeCoB_{40}\%$ PVD targets even more vulnerable. The cracked $FeCoB_{40}\%$ PVD targets result in deteriorated particle performances of the films deposited based thereon. It should be understood that although FeCoB PVD targets are used as an example, the above-identified issues may exist in other PVD targets as well. Last but not least, each of those commonly used FeCoB PVD targets has a fixed boron concentration such as 20%, 30%, 40%, and 50%. The boron concentration is discrete (i.e., not continuous). This leads to difficulties when a specific boron concentration that is not commonly used (e.g., 27.5%) is desired.

In accordance with some aspects of the disclosure, methods for depositing a film on a substrate and corresponding simultaneously-used PVD targets are provided. A pair of PVD targets are both exposed at the same time (i.e., simultaneously) during the deposition of a FeCoB film. One is a $FeCoB_{20}\%$ PVD target, and the other is a boron PVD target. By choosing different PVD parameters, different boron concentrations of the FeCoB film deposited on the substrate can be achieved. The boron concentration can vary continuously, as desired. In other words, the boron concentration can be tuned by using the $FeCoB_{20}\%$ PVD target and the boron PVD target at the same time. The PVD parameters that can be used to tune the boron concentration of the film include one or more of the following parameters: the voltages applied to the PVD targets; the deposition duration; the concentration of the plasma-forming gas such as argon (Ar).

The in situ and tunable deposition of the FeCoB film offers more flexibility and reduces the risk of cracked $FeCoB_{40}\%$ PVD targets.

FIG. 1 is a schematic diagram illustrating an example PVD system 100 in accordance with some embodiments. The PVD system 100 is capable of depositing a film onto a substrate 102 using one or more PVD targets 104. During the PVD process, the one or more PVD targets 104 are bombarded by energetic ions, such as plasma, causing material to be knocked off the one or more PVD targets 104 and deposited as a film on the substrate 102. In the example shown in FIG. 2, there are two PVD targets 104. It should be understood that more than two PVD targets can be used, which is within the scope of the disclosure.

In some embodiments, the PVD system 100 is a magnetron PVD system including a chamber body 112, which encloses a processing region or a plasma zone 114. A substrate support 120 is disposed within the chamber body 112. The substrate support 120 has a substrate receiving surface 122 that receives and supports the substrate 102 during the PVD process, so that a surface of the substrate 102 is opposite to the front surfaces 222 of the one or more PVD targets 104 that are exposed to the processing region 114. The one or more PVD targets 104 are disposed on a lid 101. The substrate support 120 is electrically conductive and is coupled to ground (GND) so as to define an electrical field between the one or more PVD targets 104 and the substrate 102. In some embodiments, the substrate support 120 is composed of aluminum, stainless steel, or ceramic material. In some embodiments, the substrate support 120 is an electrostatic chuck that includes a dielectric material.

A shield 130, also referred to as a "dark space shield," is positioned inside the PVD chamber body 112 and proximate sidewalls 205 of the one or more PVD targets 104 to protect inner surfaces of the chamber body 112 and sidewalls 205 of the one or more PVD targets 104 from unintended deposition. The shield 130 is positioned very close to the target sidewall 205 to minimize re-sputtered material from being deposited thereon. The shield 130 has a plurality of apertures (not shown) defined therethrough for admitting a plasma-forming gas such as argon (Ar) from the exterior of the shield 130 into its interior.

A power supply 140 is electrically coupled to the backing plates 210 of the one or more PVD targets 104 through the lid 101. The backing plates 210 are attached to the target plates 220, which contain different source materials of the PVD targets 104. The power supply 140 is configured to negatively bias the one or more PVD targets 104 with respect to the chamber body 112 to excite a plasma-forming gas, for example, argon (Ar), into a plasma. In some embodiments, the power supply 140 is a direct current (DC) power supply source. In other embodiments, the power supply 140 is a radio frequency (RF) power supply source.

A magnet assembly 150 is disposed above the one or more PVD targets 104. The magnet assembly 150 is configured to project a magnetic field parallel to the front surfaces 222 of the one or more PVD targets 104 to trap electrons, thereby increasing the density of the plasma and increasing the sputtering rate. In some embodiments, the magnet assembly 150 is configured to scan about the back of the one or more PVD targets 104 to improve the uniformity of deposition. In some embodiments, the magnet assembly 150 includes a single magnet disposed above the one or more PVD targets 104. In some embodiments, the magnet assembly 150 includes an array of magnets. In some embodiments and as shown in FIG. 1, the magnet assembly 150 includes a pair of back magnets 152 disposed above the one or more PVD target 104. In some embodiments and as shown in FIG. 1, the magnet assembly 150 also includes a side electromagnet 154 around the chamber body 112.

A gas source 160 is in fluidic combination with the chamber body 112 via a gas supply pipe 164. The gas source 160 is configured to supply a plasma-forming gas to the process region 114 via the gas supply pipe. The plasm-forming gas is an inert gas and does not react with the materials in the one or more PVD targets 104. In some embodiments, the plasma-forming gas includes argon (Ar), xenon (Xe), neon (Ne), or helium (He), which is capable of energetically impinging upon and sputtering source material (and the dopant in some embodiments) from the one or more PVD targets 104. In some embodiments, the gas source 160 is also configured to supply a reactive gas into the PVD system 100. The reactive gas includes one or more of an oxygen-containing gas, a nitrogen-containing gas, a meth-ane-containing gas, that is capable of reacting with the sputtering source material in the one or more PVD targets 104 to form a layer on the substrate 102.

A vacuum device 170 is in fluidic communication with the PVD system 100 via an exhaust pipe 174. The vacuum device 170 is used to create a vacuum environment in the PVD system 100 during the PVD process. In some embodi-ments, the PVD system 100 has a pressure in a range from about 1 mTorr to about 10 Torr. The spent process gases and byproducts are exhausted from the PVD system 100 through the exhaust pipe 174.

Figure 2:
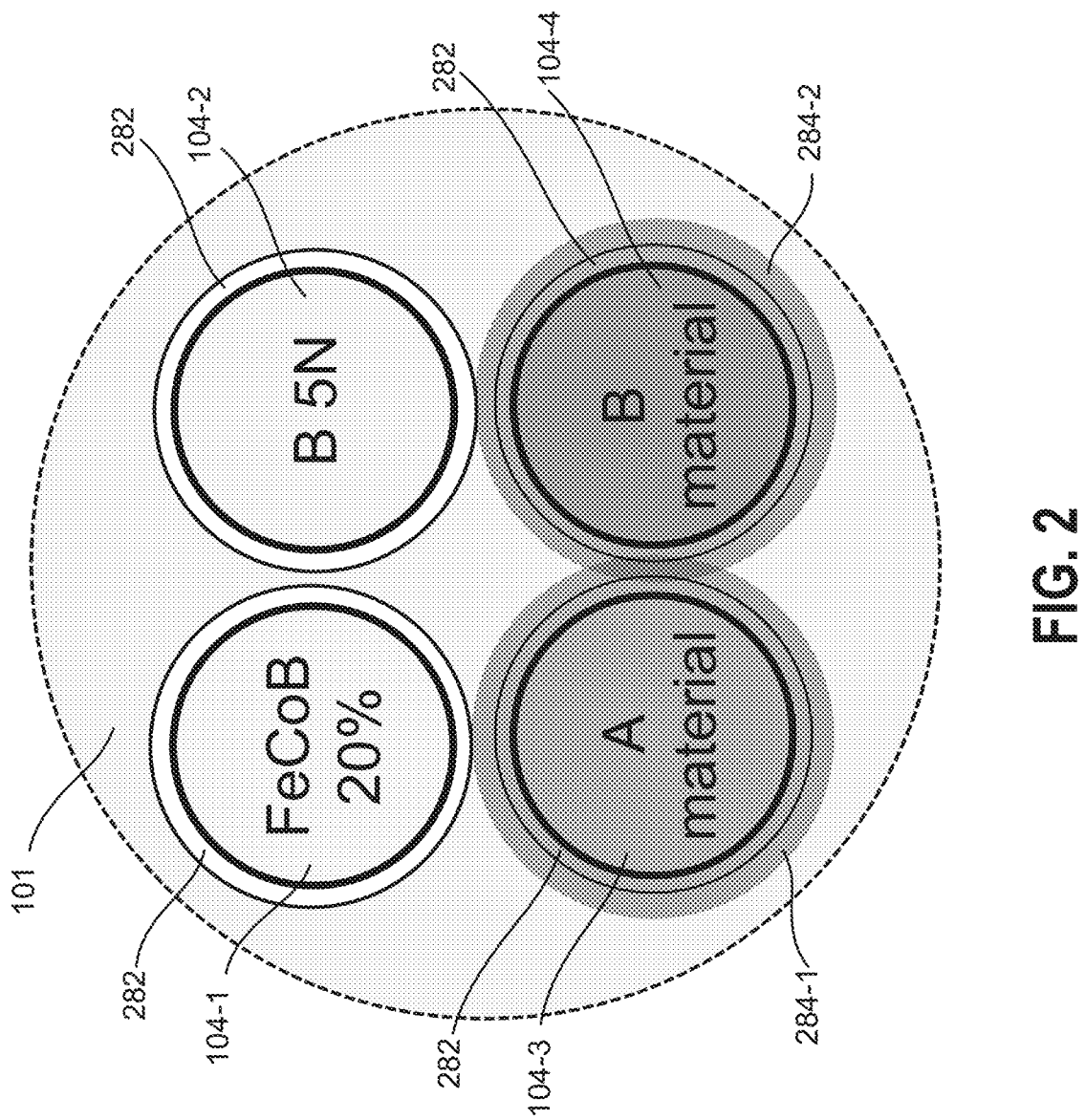
FIG. 2 is a bottom view of the lid of FIG. 1 in accordance with some embodiments.
Figure 3:
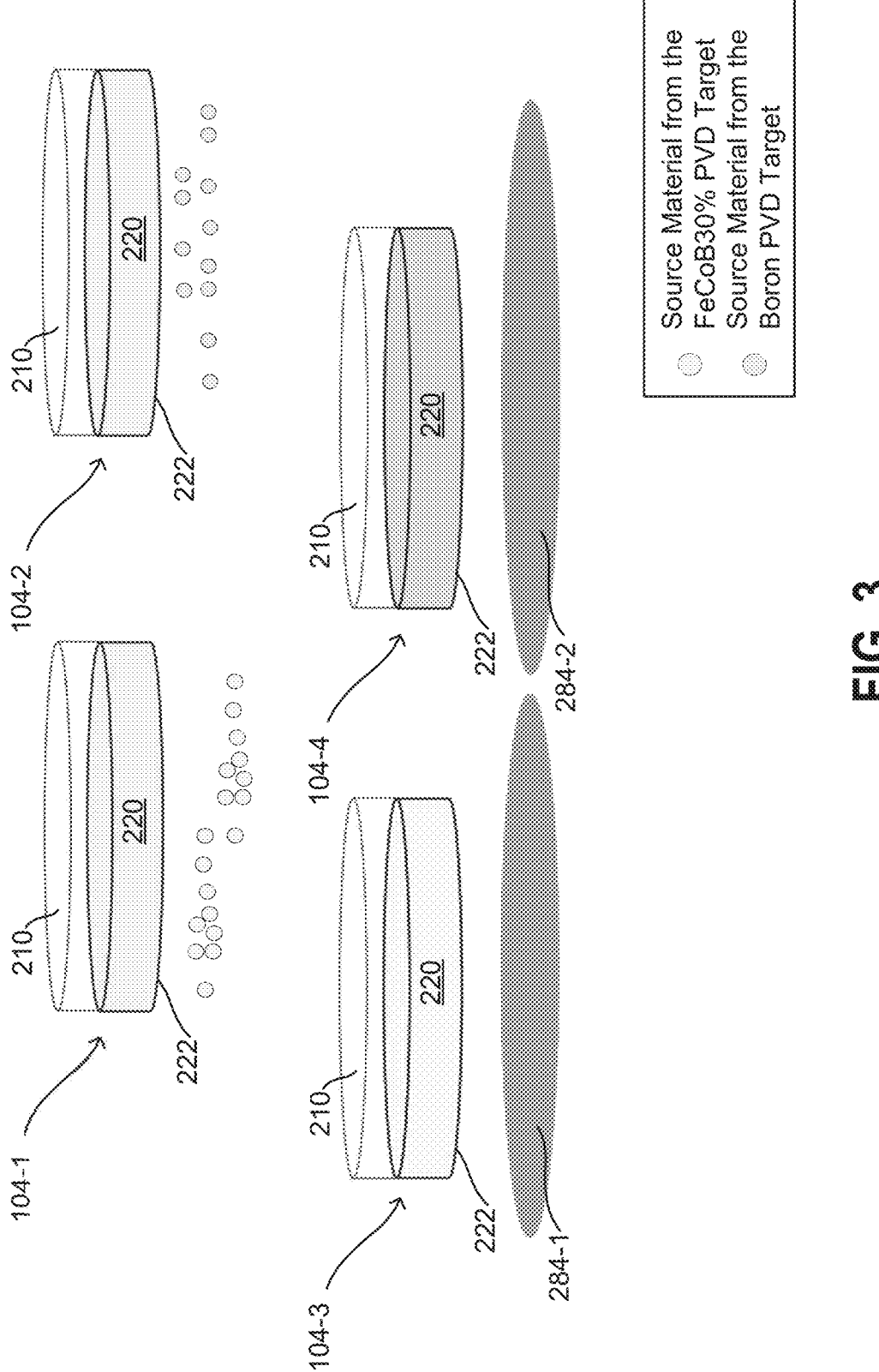
FIG. 3 is a perspective view of PVD targets in accordance with some embodiments.

FIG. 2 is a bottom view of the lid 101 of FIG. 1 in accordance with some embodiments. FIG. 3 is a perspective view of PVD targets in accordance with some embodiments. In the example shown in FIG. 2, the lid 101 has four recesses 282. Four PVD targets 104-1, 104-2, 104-3, and 104-4 are located in the four recesses 282, respectively. In the example shown in FIG. 2, the PVD target 104-1 is a $FeCoB_{20}\%$ target, the PVD target 104-2 is a boron (B) target, the PVD target 104-3 is a PVD target that contains material A, and the PVD target 104-4 is a PVD target that contains material B. It should be understood that although there are four PVD targets 104-1, 104-2, 104-3, and 104-4 in the example shown in FIG. 2, this is not intended to be limiting. In another example, the lid 101 has two recesses 282 that accommodate the PVD target 104-1 (a $FeCoB_{20}\%$ target) and the PVD target 104-2 (a boron target).

In the example shown in FIG. 2, the PVD target 104-3 is covered by a shutter 284-1, and the PVD target 104-4 is covered by a shutter 284-2. The shutters 284-1 and 284-2 can be controlled to cover or expose the corresponding PVD targets 104-3 and 104-4, respectively. As such, three targets (e.g., the PVD targets 104-1, 104-2, 104-3) or four targets (e.g., the PVD targets 104-1, 104-2, 104-3, 104-4) can be exposed and used in the deposition of the film on the substrate 102.

Now referring to FIG. 3, the PVD targets 104-1, 104-2, 104-3, and 104-4 are formed in a circular shape. It should be noted that this is not intended to be limiting, and PVD targets with other shapes such as square, rectangular, oval, trian-gular, and the like may be used. As explained above, each PVD target has a backing plate 210 and a target plate 220.

The backing plate 210 is composed of or made from a conductive material, such as copper, copper alloys, zinc, copper-zinc alloys, steel, stainless steel, iron, nickel, chro-mium, copper-chromium alloys, aluminum, lead, silicon, alloys thereof, derivatives thereof, or combinations thereof. In some embodiments, the backing plate 210 contains cop-per or a copper alloy. In some embodiments, the backing plate 210 includes a copper alloy having a copper concentration in a range from about 50% by weight to about 99.9% by weight, such as from about 55% by weight to about 95% by weight. In some other embodiments, the backing plate 210 includes a copper alloy having a copper concentration in a range from about 50% by weight to about 70% by weight. In some embodiments, the backing plate 210 includes a copper-zinc alloy. In some embodiments, the copper-zinc alloy has a copper concentration in a range from about 58% by weight to about 62% by weight and a zinc concentration in a range from about 38% by weight to about 42% by weight. In a specific example, the copper-zinc alloy of the backing plate 210 contains about 60.8% copper by weight and about 39.3% zinc by weight. In other embodiments, the copper-zinc alloy has a copper concentration in a range from about 75% by weight to about 85% by weight and a zinc concentration in a range from about 15% by weight to about 25% by weight. In one specific example, the copper-zinc alloy of the backing plate 210 contains about 80% copper by weight and about 20% zinc by weight. In some embodi-ments, the backing plate 210 includes a copper-chromium alloy having a copper concentration in a range from about 95% by weight to about 99.5% by weight and a chromium concentration in a range from about 0.5% by weight to about 5% by weight. In a specific example, the copper-chromium alloy of the backing plate 210 contains about 99% copper by weight and about 1% chromium by weight.

As explained above, each target plate 220 has a front surface 222 that is sputtered during the PVD process. The materials in the target plate 220 are, thus, deposited onto the substrate 102 shown in FIG. 1. In some embodiments, the front surface 222 of the target plate 220 is substantially flat. In some embodiments, the front surface 222 of the target plate 220 is curved. The target plate 220 contains corre-sponding source material. For instance, the target plate 220 of the PVD target 104-1 contains $FeCoB_{20}\%$; the target plate 220 of the PVD target 104-2 contains boron; the target plate 220 of the PVD target 104-3 contains material A; the target plate 220 of the PVD target 104-4 contains material B. In some embodiments, each target plate 220 further includes a dopant. The dopant affects the deposition rate of the sput-tering source material, which in turn changes the PVD process window and improves wafer acceptance testing (WAT) yield.

As shown in FIG. 3, the PVD targets 104-1 and 104-2 are used simultaneously in the PVD system 100 for depositing a FeCoB film on the substrate 102. Both the PVD targets 104-1 and 104-2 are exposed at the same time (i.e., simul-taneously). In conventional practice, FeCoB PVD targets with fixed boron concentrations are used. The boron con-centration is discrete and cannot be tuned in situ. For example, a $FeCoB_{20}\%$ PVD target is used. If the boron concentration is lower than expected, the next boron con-centration commonly available is 30%. There is no other boron concentration options between those two boron con-centrations (i.e., 20% and 30%). This significantly limits the flexibility of PVD processes. Moreover, $FeCoB_{40}\%$ PVD targets are unstable and easy to crack. The long-distance transportation from vendors to foundries and IDMs makes $FeCoB_{40}\%$ PVD targets even more vulnerable.

In contrast, in accordance with embodiments of this disclosure, a $FeCoB_{20}\%$ PVD target 104-1 and a boron PVD target 104-2 are simultaneously exposed and used. In one example, the boron PVD target 104-2 has a high purity level, such as a purity level of about 99.999% (5N) or greater. The purity level is indicative of the source material concentration relative to the centration of impurities (other than the dopant that is intentionally introduced in some embodiments). In another example, the boron PVD target 104-2 has a high purity level of about 99.99% (4N) or greater. In yet another example, the boron PVD target 104-2 has a high purity level of about 99.9% (3N) or greater. By choosing different PVD parameters, different boron concentrations of the FeCoB film deposited on the substrate 102 can be achieved. The boron concentration can vary continuously, as desired. In other words, the boron concentration can be tuned by using the FeCoB$_{20}$% PVD target 104-1 and a boron PVD target 104-2 together. The PVD parameters that can be used to tune the boron concentration of the film include one or more of the following parameters: the voltages applied to the PVD targets; the deposition duration; the concentration of the plasma-forming gas such as argon (Ar).

Figure 4A:
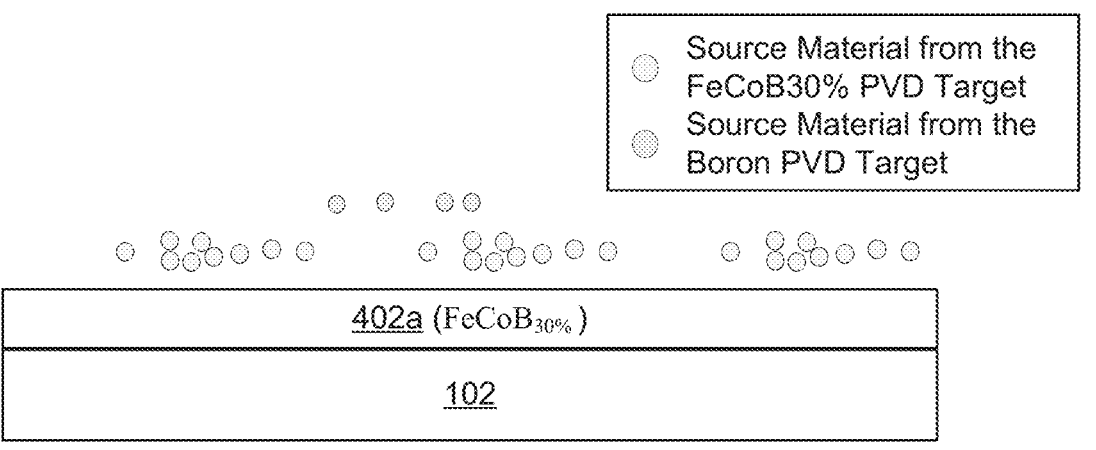
FIGS. 4A-4C are schematic diagrams illustrating the formation of FeCoB films with different boron concentration in accordance with some embodiments.
Figure 4B:
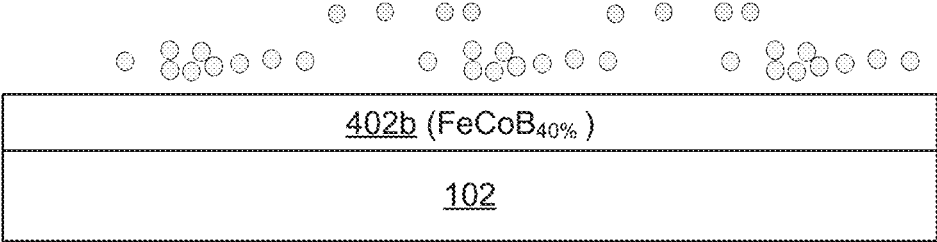
Figure 4C:
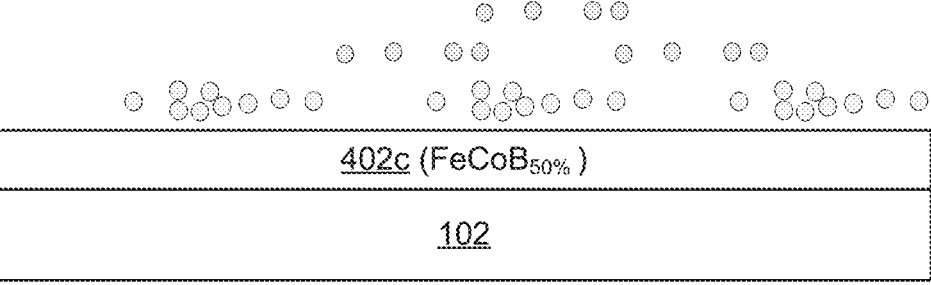

FIGS. 4A-4C are schematic diagrams illustrating the formation of FeCoB films with different boron concentrations in accordance with some embodiments. In the example shown in FIG. 4A, source materials from the FeCoB$_{20}$% PVD target 104-1 and source materials from the boron PVD target 104-2 are deposited on the substrate 102, and a FeCoB$_{30}$% film 402a is formed on the substrate 102 as a result. In the example shown in FIG. 4B, source materials from the FeCoB$_{20}$% PVD target 104-1 and source materials from the boron PVD target 104-2 (more as compared to the example shown in FIG. 4A) are deposited on the substrate 102, and a FeCoB$_{40}$% film 402b is formed on the substrate 102 as a result. In the example shown in FIG. 4C, source materials from the FeCoB$_{20}$% PVD target 104-1 and source materials from the boron PVD target 104-2 (more as compared to the example shown in FIG. 4B) are deposited on the substrate 102, and a FeCoB$_{50}$% film 402c is formed on the substrate 102 as a result. Therefore, those commonly used boron concentrations (e.g., 30%, 40%, and 50%) can be achieved in situ. The FeCoB$_{40}$% PVD target, which is easy to crack, especially during the transportation from vendors to IDMs and foundries, can be avoided and replaced by the more stable FeCoB$_{20}$% PVD target and the boron PVD target.

It should be understood that the boron concentration of 20% can also be achieved by not using the boron PVD target. In some implementations, the boron PVD target 104-2 shown in FIG. 3 is covered by another shutter. In other implementations, the boron PVD target 104-2 is removed temporarily from the PVD system 100. It should also be understood that although only three example boron concentrations (i.e., 30%, 40%, and 50%) are illustrated in FIGS. 4A-4C, other boron concentrations can be achieved as well. As explained above, by varying the PVD parameters, the boron concentration can be tuned and can vary continuously, as desired.

The boron concentration can vary continuously, as desired. In other words, the boron concentration can be tuned by using the FeCoB$_{20}$% PVD target 104-1 and a boron PVD target 104-2 together. The PVD parameters that can be used to tune the boron concentration of the film include one or more of the following parameters: the voltages applied to the PVD targets; the deposition duration; the concentration of the plasma-forming gas such as argon (Ar).

Figure 5:
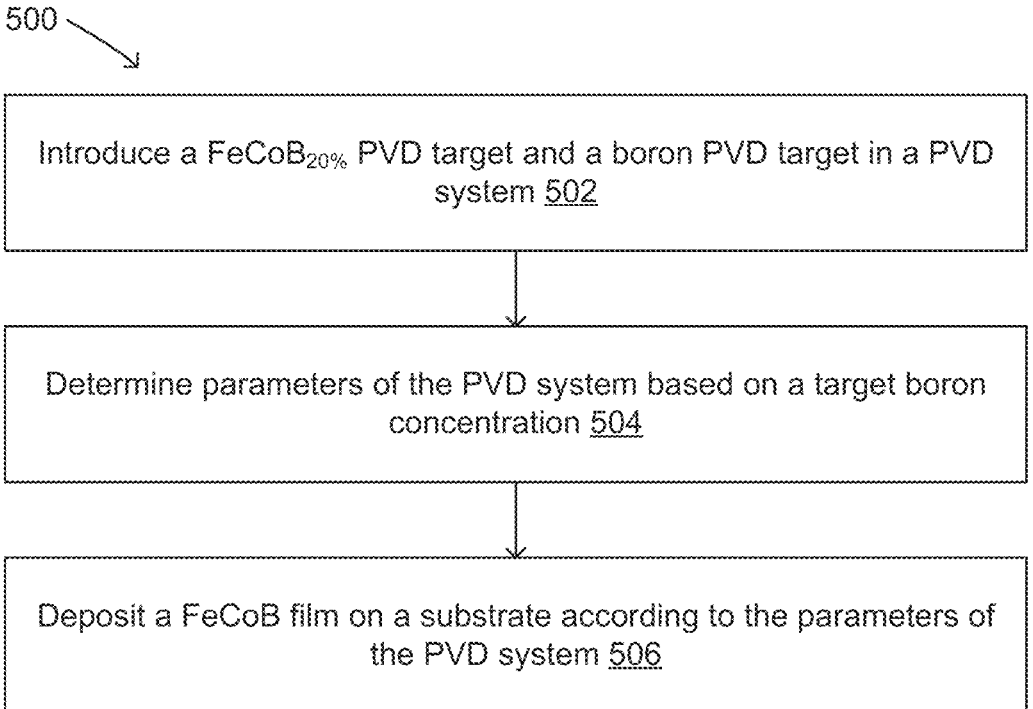
FIG. 5 is a flowchart illustrating an example method for forming a FeCoB film on a substrate in accordance with some embodiments.

FIG. 5 is a flowchart illustrating an example method 500 for forming a FeCoB film on a substrate in accordance with some embodiments. In the example shown in FIG. 5, the method 500 includes operations 502, 504, and 506. Additional operations may be performed. Also, it should be understood that the sequence of the various operations discussed above with reference to FIG. 5 is provided for illustrative purposes, and as such, other embodiments may utilize different sequences. These various sequences of operations are to be included within the scope of embodiments.

At operation 502, a FeCoB$_{20}$% PVD target and a boron PVD target are introduced in a PVD system. In one example, the FeCoB$_{20}$% PVD target is the PVD target 104-1 shown in FIG. 2, the boron PVD target is the PVD target 104-2 shown in FIG. 2, and the FeCoB$_{20}$% PVD target and the boron PVD target are introduced in recesses 282 of the lid 101 of the PVD system 100 shown in FIGS. 1-2.

At operation 504, parameters of the PVD system are determined based on a target boron concentration. In one example, the target boron concentration is 30%. In another example, the target boron concentration is 40%. In yet another example, the target boron concentration is 50%. Once the target boron concentration is known, parameters of the PVD system, for example, the PVD system 100 shown in FIG. 1, can be determined based on a target boron concentration, as explained above.

At operation 506, a FeCoB film is deposited on a substrate according to the parameters of the PVD system. In one example, the PVD system shown in FIG. 1 operates, according to the parameters determined at operation 504, to deposit a film on the substrate.

It should be understood that although the method 500 shown in FIG. 5 is used for depositing a FeCoB film on a substrate, similar methods can be applied to the in situ and tunable deposition of other films on a substrate. Those similar methods will be described below with reference to FIGS. 7A and 7B. It should also be noted that other materials can be added to the FeCoB film using the method 500. In one implementation, this can be achieved by using one or more PVD targets (e.g., the PVD targets 104-3 and 104-4) in addition to the FeCoB$_{20}$% PVD target and the boron PVD target.

Figure 6:
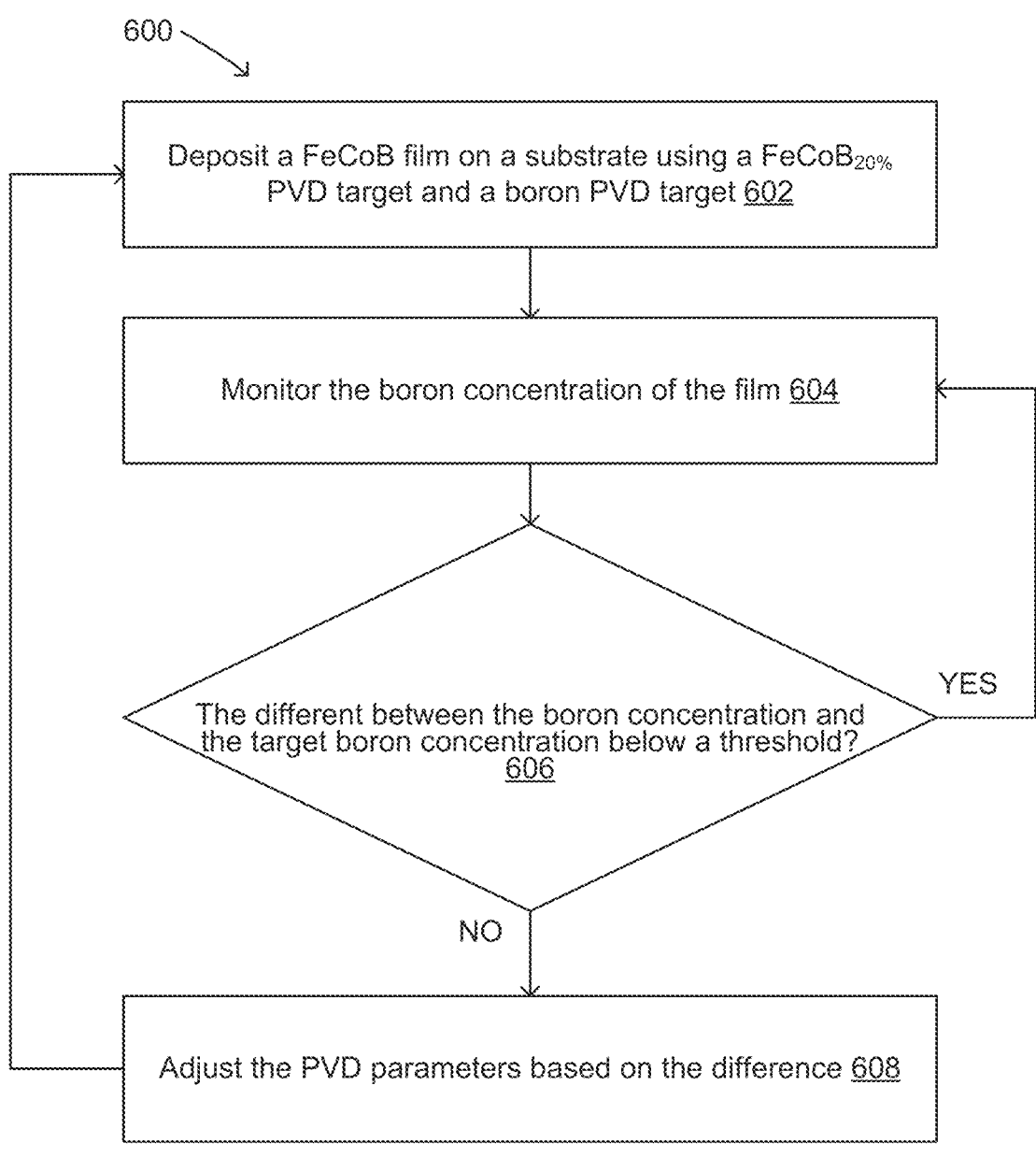
FIG. 6 is a flowchart illustrating an example method for dynamically tuning the boron concentration in accordance with some embodiments.

FIG. 6 is a flowchart illustrating an example method 600 for dynamically tuning the boron concentration in accordance with some embodiments. In the example shown in FIG. 6, the method 600 includes operations 602, 604, 608, and 610. Additional operations may be performed. Also, it should be understood that the sequence of the various operations discussed above with reference to FIG. 6 is provided for illustrative purposes, and as such, other embodiments may utilize different sequences. These various sequences of operations are to be included within the scope of embodiments.

At operation 602, a FeCoB film is deposited on a substrate using a FeCoB$_{20}$% PVD target and a boron PVD target. In one implementation, operation 602 can be fulfilled by method 500. In other words, a FeCoB$_{20}$% PVD target and a boron PVD target are introduced in a PVD system, and parameters of the PVD system are determined based on a target boron concentration, and then a FeCoB film is deposited on the substrate according to the parameters of the PVD system.

At operation 604, the boron concentration of the film is monitored. In one implementation, the boron concentration of the film is monitored by using X-ray photoelectron spectroscopy (XPS). XPS is a surface-sensitive quantitative spectroscopic technique based on photoelectric effect that can identify the elements that exist within the film as well as their chemical states. Because the energy of an X-ray with a particular wavelength is known, and because the emitted electrons' kinetic energies are measured, the electron binding energy of each of the emitted electrons can be determined by using the photoelectric effect equation. It should be understood that this is not intended to be limiting, and other techniques can be used to monitor the boron concentration of the film.

At operation 606, it is determined whether the difference between the boron concentration and the target boron concentration is below a threshold. In one example, the target boron concentration is 40%, and the threshold is a predetermined value such as 1%, then the difference is below the threshold when the boron concentration is higher than 39% but lower than 41%. The threshold can be set based on factors such as the design variance tolerance.

If the difference between the boron concentration and the target boron concentration is below the threshold, the method 600 proceeds to operation 604, where the boron concentration of the film is monitored. In other words, the boron concentration of the film 604 may be monitored repeatedly. In one example, the boron concentration of the film is dynamically monitored until the deposition is completed.

If the difference between the boron concentration and the target boron concentration is equal to or greater than the threshold, the method 600 proceeds to operation 608, where the PVD parameters are adjusted based on the difference. Then, the method proceeds to operation 602 again, where the FeCoB film is deposited on the substrate using the $FeCoB_{20}$% PVD target and the boron PVD target, based on the adjusted PVD parameters. The boron concentration of the film 604 is monitored again at operation 604. By adjusting the PVD parameters, the difference between the boron concentration and the target boron concentration can become below the threshold. As such, the boron concentration of the film is adjusted to ensure that the difference between the boron concentration and the target boron concentration is below the threshold.

Figure 7A:
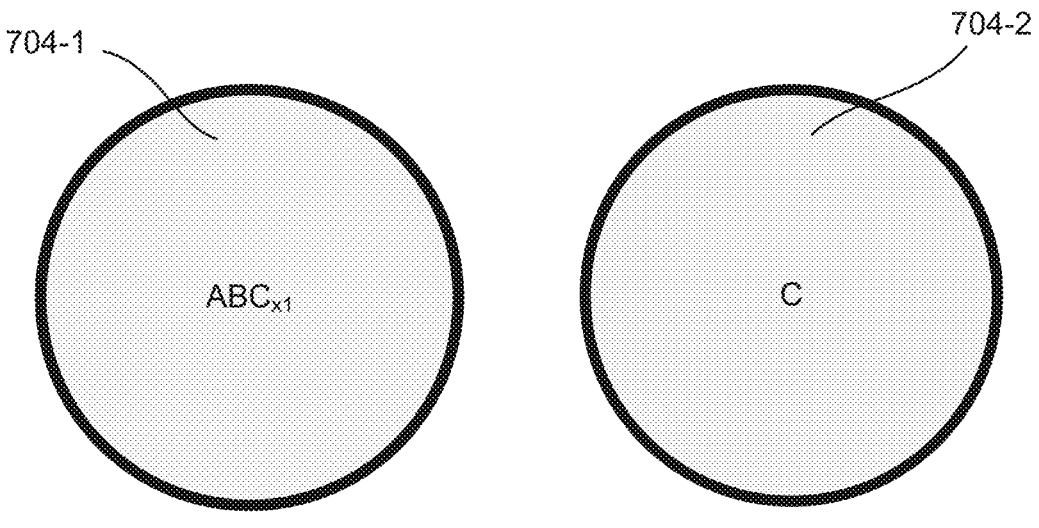
FIG. 7A is a diagram illustrating two PVD targets that are used for in situ and tunable deposition of a film on a substrate in accordance with some embodiments.
Figure 7B:
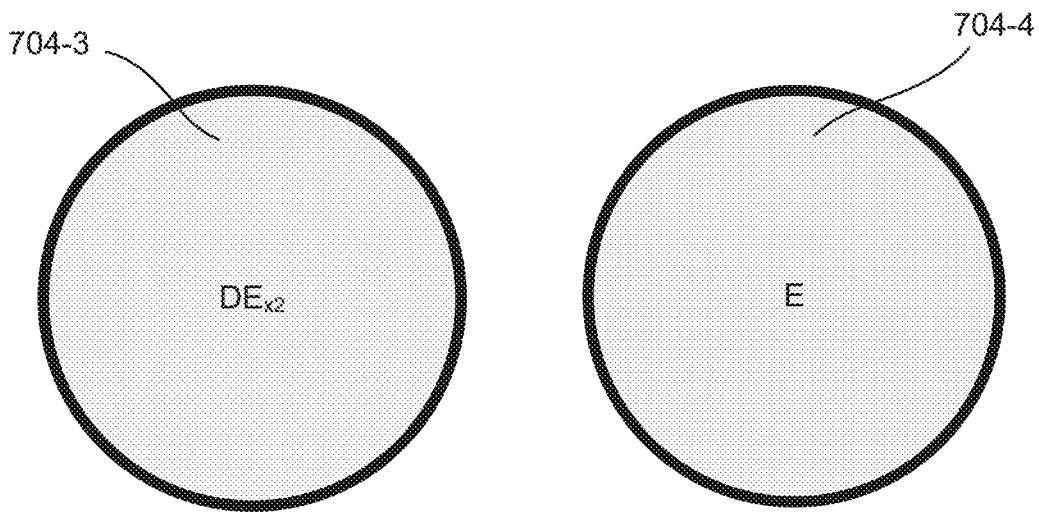
FIG. 7B is a diagram illustrating two PVD targets that are used for in situ and tunable deposition of a film on a substrate in accordance with some embodiments.

As mentioned above, the method 500 can be applied to the in situ and tunable deposition of other films on a substrate. FIG. 7A is a diagram illustrating two PVD targets that are used for in situ and tunable deposition of a film on a substrate in accordance with some embodiments. FIG. 7B is a diagram illustrating two PVD targets that are used for in situ and tunable deposition of a film on a substrate in accordance with some embodiments.

In the example shown in FIG. 7A, a PVD target 704-1 contains an alloy of three elements A, B, and C. The alloy can be represented as $ABC_{x1}$, where x1 is the atomic percentage of element C. On the other hand, a PVD target 704-2 contains element C. A method similar to method 500 shown in FIG. 5 can be used to deposit a film of the alloy of elements A, B, and C, and the deposition of the film is in situ and tunable, with the concentration of element C higher than x1. In one example, x1 is 20%, and the concentration of element C in the film is 30%. In another example, x1 is 10%, and the concentration of element C in the film is 45%. In yet another example, x1 is 5%, and the concentration of element C in the film is 7%. It should be understood that these examples are not intended to be limiting.

In the example shown in FIG. 7B, a PVD target 704-3 contains an alloy of two elements D and E. The alloy can be represented as $DE_{x2}$, where x2 is the atomic percentage of element D. On the other hand, a PVD target 704-4 contains element E. A method similar to method 500 shown in FIG. 5 can be used to deposit a film of the alloy of elements D and E, and the deposition of the film is in situ and tunable, with the concentration of element E higher than x2. In one example, x2 is 20%, and the concentration of element E in the film is 30%. In another example, x2 is 10%, and the concentration of element E in the film is 45%. In yet another example, x2 is 5%, and the concentration of element E in the film is 7%. It should be understood that these examples are not intended to be limiting.

As illustrated in the examples shown in FIGS. 7A and 7B, the methodology described above with reference to FIGS. 1-6 is generally applicable to the deposition of a film using PVD targets that contain various materials. In one example, the PVD target 704-3 shown in FIG. 7B contains titanium aluminide (TiAl), and the atomic percentage of Al is 50% (i.e., $Ti_{50}$% $Al_{50}$%). By providing the PVD target 704-4 shown in FIG. 7B, which contains Al, the deposition of a film of TiAl is in situ and tunable, with the concentration of Al higher than 50%.

In accordance with some aspects of the disclosure, a method is provided. The method includes the following steps: introducing a first PVD target and a second PVD target in a PVD system, the first PVD target containing a boron-containing cobalt iron alloy (FeCoB) with an initial boron concentration, and the second PVD target containing boron; determining parameters of the PVD system based on a target boron concentration larger than the initial boron concentration; and depositing a FeCoB film on a substrate according to the parameters of the PVD system.

In accordance with some aspects of the disclosure, a pair of PVD targets are provided. The pair of PVD targets include a first PVD target containing a boron-containing cobalt iron alloy (FeCoB) and a second PVD target containing boron. The first PVD target and the second PVD target are used simultaneously in a PVD system for depositing a FeCoB film on a substrate.

In accordance with some aspects of the disclosure, a method is provided. The method includes the following steps: introducing a first PVD target and a second PVD target in a PVD system, the first PVD target containing an alloy of a first element, a second element, and a third element with an initial concentration of the third element, and the second PVD target containing the third element; determining parameters of the PVD system based on a target concentration of the third element larger than the initial concentration of the third element; and depositing a film of the alloy of the first element, the second element, and the third element on a substrate according to the parameters of the PVD system.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A physical vapor deposition (PVD) system, comprising:

a chamber body;

a first PVD target and a second PVD target, the first PVD target containing a boron-containing cobalt iron alloy (FeCoB) with an initial boron concentration, and the second PVD target being a boron PVD target consisting of boron;

an X-ray photoelectron spectroscopy (XPS) instrument configured to monitor a boron concentration of a FeCoB film deposited on a substrate disposed, using the first PVD target and the second PVD target simultaneous, in the chamber body; and a controller configured to determine parameters of the PVD system based on a target boron concentration that is larger than the initial boron concentration, wherein the controller is configured to continuously tune the boron concentration of the FeCoB film by adjusting the parameters of the PVD system when a difference between the boron concentration of the FeCoB film and the target boron concentration is equal to or greater than a threshold.

2. The PVD system of claim 1, wherein the parameters of the PVD system includes at least one of: voltages applied to the first PVD target and the second PVD target; a deposition duration; and a concentration of a plasma-forming gas.

3. The PVD system of claim 1, wherein the parameters of the PVD system are adjusted by varying a voltage ratio between the first PVD target and the second PVD target.

4. The PVD system of claim 1, wherein the first PVD target and the second PVD target are placed in a first recess and a second recess, respectively, in a lid of the PVD system.

5. A physical vapor deposition (PVD) system, comprising:

a chamber body;

a substrate support disposed in the chamber body and configured to support a substrate;

a first PVD target containing a boron-containing cobalt iron alloy (FeCoB) with an initial boron concentration;

a second PVD target, wherein the second PVD target is a boron PVD target consisting of boron;

an X-ray photoelectron spectroscopy (XPS) instrument configured to monitor a boron concentration of a FeCoB film deposited, using the first PVD target and the second PVD target simultaneous, on the substrate; and a controller configured to determine parameters of the PVD system based on a target boron concentration that is larger than the initial boron concentration, wherein the controller is configured to continuously tune the boron concentration of the FeCoB film by adjusting the parameters of the PVD system based on when a difference between the boron concentration of the FeCoB film and the target boron concentration is equal to or greater than a threshold.

6. The PVD system of claim 5, further comprising:

a lid comprising a first recess and a second recess, wherein the first PVD target and the second PVD target are placed in the first recess and the second recess, respectively.

7. The PVD system of claim 6, further comprising:

a first shutter corresponding to the first recess; and a second shutter corresponding to the second recess; and wherein the first shutter and the second shutter are controlled to cover or expose the first PVD target and the second PVD target.

8. The PVD system of claim 7, wherein the lid further comprises:

a third recess configured to accommodate a third PVD target; and a third shutter corresponding to the third recess, wherein the third shutter is controlled to cover or expose the third PVD target.

9. The PVD system of claim 5, wherein the parameters of the PVD system includes at least one of: voltages applied to the first PVD target and the second PVD target; a deposition duration; and a concentration of a plasma-forming gas.

10. The PVD system of claim 5, wherein the parameters of the PVD system are adjusted by varying a voltage ratio between the first PVD target and the second PVD target.

11. The PVD system of claim 5, wherein the threshold is 1%.

12. The PVD system of claim 5, wherein the XPS instrument is further configured to continuously monitor the boron concentration of the FeCoB film.

13. The PVD system of claim 5, wherein the target boron concentration is tunable.

14. The PVD system of claim 5, wherein the target boron concentration ranges continuously from 20% to 50%.

15. A physical vapor deposition (PVD) system, comprising:

a chamber body;

a substrate support disposed in the chamber body and configured to support a substrate;

a first PVD target containing a boron-containing cobalt iron alloy (FeCoB) with an initial boron concentration;

a second PVD target, wherein the second PVD target is a boron PVD target consisting of boron, wherein the first PVD target and the second PVD target are used simultaneously to deposit a FeCoB film on the substrate;

an X-ray photoelectron spectroscopy (XPS) instrument configured to monitor a boron concentration of the FeCoB film; and a controller configured to determine parameters of the PVD system based on a target boron concentration that is larger than the initial boron concentration, wherein the controller is configured to continuously tune the boron concentration of the FeCoB film by adjusting the parameters of the PVD system when a difference between the boron concentration of the FeCoB film and the target boron concentration is equal to or greater than a threshold.

16. The PVD system of claim 15, wherein the target boron concentration is tunable.

17. The PVD system of claim 1, wherein the initial boron concentration is 20%.

18. The PVD system of claim 5, wherein the initial boron concentration is 20%.

19. The PVD system of claim 15, wherein the initial boron concentration is 20%.

20. The PVD system of claim 15, wherein the second PVD target has a purity level of 99.9% or greater.

* * * * *